United States Patent [19]

Katow

[11] 3,829,887

[45] Aug. 13, 1974

[54] TARGET OF A CATHODE-RAY TUBE

[75] Inventor: Takehumi Katow, Tokyo, Japan

[73] Assignee: Iwaski Tsushinki Kabushiki Kaisha (a/k/a Iwatsu Electric Co., Ltd.), Tokyo-to, Japan

[22] Filed: Dec. 26, 1972

[21] Appl. No.: 318,641

[30] Foreign Application Priority Data

Dec. 24, 1971 Japan .................................. 46-3154
Aug. 10, 1972 Japan .................................. 47-79508

[52] U.S. Cl. .................................. 357/31, 357/4
[51] Int. Cl. .................................. H01l 15/00
[58] Field of Search ...... 317/235 N, 235 NA, 234 S, 317/234 T

[56] References Cited

UNITED STATES PATENTS

| | | | |
|---|---|---|---|
| 3,467,880 | 9/1969 | Crowell | 315/11 |
| 3,701,914 | 10/1972 | Amelio | 313/66 |

*Primary Examiner*—Martin H. Edlow
*Attorney, Agent, or Firm*—Robert E. Burns; Emmanuel J. Labato; Bruce L. Adams

[57] ABSTRACT

A target of a cathode-ray tube comprises a semiconductor substrate of a single conductivity type monocrystalline semiconductor having a major surface uniformly coated by a highly insulating material layer, and a metallic electrode having a plurality of apertures formed therein disposed on a surface of the insulating layer. Another electrode is disposed on a second major surface of the substrate.

5 Claims, 9 Drawing Figures

PATENTED AUG 1 3 1974 3,829,887

TARGET OF A CATHODE-RAY TUBE

This invention relates to a target of a cathode-ray tube usable as a camera tube or a storage tube.

As a so-called silicon vidicon target, a target formed by a PN junction and a surface barrier photodiode array has been heretofore proposed in addition to that formed by a silicon monocrystal. However, any of them has various problems left unsolved which should be overcome for its practical application.

In the case of the target formed by the PN junction and the surface barrier photodiode array fine processing is achieved by a mosaic separation process, that is, the photoresist method but it is extremely difficult to decrease constructional defects throughout the target.

Namely, in the case of the PN junction photodiode array target, a silicon oxide ($SiO_2$) layer formed on the silicon substrate is selectively etched away in a predetermined pattern. The selective etching in the predetermined pattern is to form about seven hundred thousand to one million apertures of 8$\mu$m in diameter at a pitch of 16 $\mu$m, for example, and this is usually achieved by the photoresist method. HF or like etchant is used but the photoresist material cannot with-stand the action of such an etchant. Accordingly it is difficult to obtain the predetermined pattern. This results in defects such that adjacent apertures are joined together or that some apertures are not formed.

In the case of a PN junction photodiode boron is diffused through the apertures formed in the $SiO_2$ layer to form P-type semiconductors so that a predetermined photodiode array cannot be obtained. These defects appear as flaws in a displayed image.

An object of this invention is to provide a target in a cathode-ray tube readily producible and having fewer structural defects, fewer flaws and less nonuniformity while having junctions substantially equivalent to those of the conventional cathode-ray tube target using the photodiode array.

In accordance with the principle of the present invention, the surface of a semiconductor substrate of a single conductivity type monocrystalline semiconductor provided in a target of a cathode-ray tube is coated by a highly insulating material layer, and the surface of the highly insulating material layer is coated by a metallic electrode having a plurality of apertures formed therein.

The object, principle, construction and operations of the target of a cathode-ray tube of this invention will be clearly understood from the following detailed discussion taken in conjunction with the accompanying drawings, in which.

For ready understand of this invention, an example of the conventional target using a PN junction photodiode array will first be described.

Figure 1:
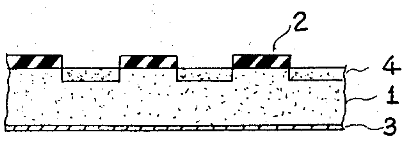
PRIOR ART Fig. 1
FIG. 1 is a cross-sectional view of a conventional silicon vidicon target employing a PN junction photodiode array.

With reference to FIG. 1 showing a cross-sectional view of the target employing the PN junction photodiode array, a reference numeral 1 indicates an N-type silicon substrate, 2 $SiO_2$ layers employed for isolating photodiodes from one another, 3 an ohmic contact electrode and 4 P-type diffused layers. This target has defects introduced in high temperature treatment processes for the formation of the oxide layer and the P-type diffused layer in addition to the constructional defects. Especially, a white flaw is considered to result from shortening of the life time of empty holes which is caused by the high temperature treatment process.

Further in the case of the surface barrier photodiode array target, fine processing of an $SiO_2$ layer is similar to that for the PN junction photodiode array target. However it is necessary to form an Au layer over the entire area of the target by the evaporation method after selective etching of the $SiO_2$ layer in a predetermined pattern and selectively etch away the Au layer on the $SiO_2$ layer. This process involves mask-watching techniques and an etching process. The photo-resist process is carried out twice which further increases defects. Accordingly structural defects increase.

Figure 2:
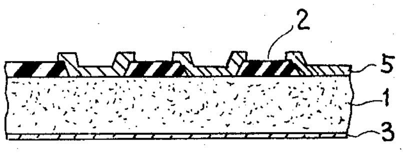
PRIOR ART Fig. 2
FIG. 2 is a cross-sectional view of a silicon vidicon target employing a surface barrier photodiode array.

With reference to FIG. 2 showing a cross-sectional view of the target employing the surface barrier photodiode array, a reference numeral 1 designates an N-type silicon substrate, 2 an $SiO_2$ layer for isolating photodiodes from one another, 3 an ohmic contact electrode and 5 Au layers. The manufacture of this target does not include any high temperature treatment process so that the life time of the empty holes is not shortened and the generation of white flaw is avoided. However, it is also difficult to reduce the structural defects in the mosaic separation process of the photodiodes.

Figure 3A:
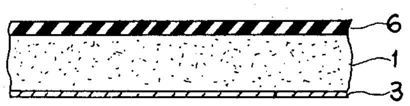
PRIOR ART Fig. 3A
FIG. 3 is a cross-sectional view of a silicon vidicon target.
Figure 3B:
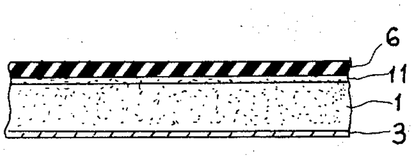
PRIOR ART Fig. 3B

With reference to FIG. 3A showing a cross-sectional view of the target using the silicon monocrystal, a reference numeral 1 indicates an N-type silicon substrate, 3 an ohmic contact electrode and 6 a highly insulating material layer. FIG. 3B schematically shows the state of a space charge layer when the target is in the reverse biased condition.

The target shown in FIG. 3A is simple in construction and does not involve the mosaic separation process as will be apparent from the illustration. In this case, resolution is maintained by the highly insulating material layer 6 formed on the substrate 1, but resolution is also low while a dark current is large.

These defects are considered to be due to the fact that the space charge layer 11 is uniformly formed at the interface between the subsrate 1 and the highly insulating material layer 6 as depicted in FIG. 3B. Namely, empty holes generated in the N-type silicon substrate 1 enter the space charge layer 11 by diffusion and are accelerated by the electric field to jump over the barrier according to their energy or neutralize negative charges in the highly insulating material layer 6 on the opposite side from the N-type silicon substrate 1 due to the tunnel effect, thereby achieving an image sensing operation. However, since the space charge layer 11 is uniformly formed as illustrated in FIG. 3B, the empty holes generated are likely to spread towards the N-type silicon substrate 1. This is a cause of lowered resolution. Further, in a case where a reverse bias voltage is increased a P-channel is uniformly formed in the space charge layer 11 and this makes it possible to increase a signal to be read out but deteriorates resolution and also increases the dark current.

If the highly insulating material layer 6 is thickened to decrease the dark current, the reverse bias voltage cannot be raised as described above, so that the signal to be read out becomes small and the residual image property becomes deteriorated.

Thus, the targets employing the silicon monocrystal have defects such as low resolution, large dark current and so on for the reasons described above.

This invention is to provide a cathode ray tube target which is free from the above-described defects.

This invention will hereinafter be described in detail.

Figure 4A:
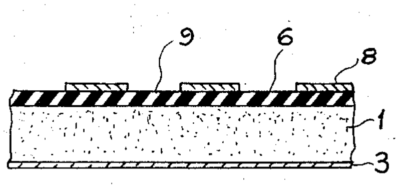
FIG. 4 shows a cross-sectional view and a perspective view of a cathode-ray tube target of this invention.
Figure 4B:
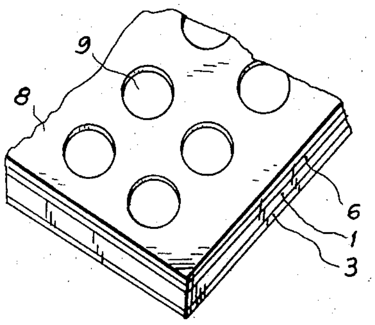

With reference to FIG. 4A showing a cross-sectional view of an embodiment of the cathode ray tube target of this invention and FIG. 4B showing its perspective view a reference numeral 1 designates a semiconductor substrate of a single conductivity type monocrystalline semiconductor formed by N-type silicon or germanium which has a thickness of about 60μm (hereinafter referred to as an N-type silicon substrate) 3 an ohmic contact electrode and 8 a metallic electrode having a thickness of about 1,000 A which is formed by the evaporation method. Apertures 9 of about 10μm in diameter are formed by the photoresist method on the metallic electrode 8 at a pitch of approximately 20μm. A reference numeral 6 indicates a layer of a high insulating material which may be formed by, for example, $Sb_2S_3$, $CaF_2$, PbO, which have a resistivity greater than $10^{12}$ ohm/cm, or the like. The insulating material layer of such a material is formed by the evaporation method. However, in the case of using $SiO_2$, it is formed by a low temperature oxide film forming method on the N-type silicon substrate 1 to a thickness of about 200 to 500 A. Furthermore, the use of $Si_3N_4$ or the like also provides the image sensing function.

The manufacture of this target starts with the formation of the highly insulating material layer 6 on the N-type silicon substrate, which is followed by the evaporation of the metallic electrode 8 and by the formation of the apertures 9 by the photoresist method.

In comparison with the mosaic separation process of the silicon oxide film used in the production of the target employing the PN junction photodiode array or the surface barrier photodiode array shown in FIG. 1 or 2, the formation of the apertures 9 by the photoresist method permits appropriate selection of the etchant and does not require as durable a resist film and hence facilitates the manufacturing process. Accordingly, the target of this invention has structural defects than the conventional ones.

Figure 5:
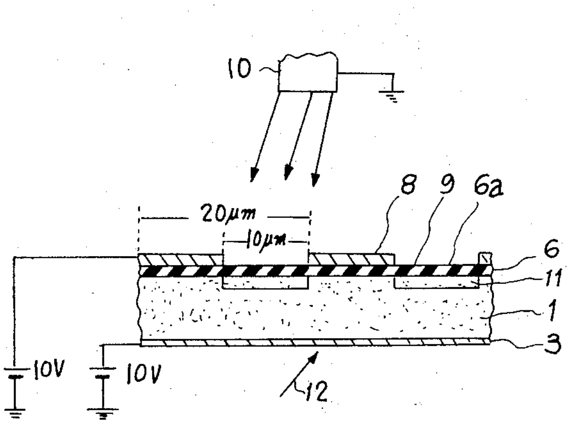
FIGS. 5 and 7 are schematic diagrams each explanatory of an image pickup operation.

With reference to FIG. 5 illustrating one example of a signal image sensing operation by the cathode-ray tube target of this invention, reference numeral 10 identifies a cathode of the cathode-ray tube which is held at ground potential. If the target is scanned with a low speed electron beam under a condition where the ohmic electrode 3 and the metallic electrode 8 are held at 10V, the surface 6*a* of a highly insulating material layer 6 corresponding to an apertured area 9 becomes equipotential with the cathode (ground potential). As a result of this, a reverse bias voltage is applied between the highly insulating material layer 6 corresponding to the apertured area 9 and the N-type silicon substrate 1, so that space charge layers 11 are produced in the N-type silicon substrate 1 so as to respectively correspond to the apertured area 9.

When light 12 is incident on the face of the target carrying the ohmic contact electrode 3 under such conditions positive electron holes are formed in the substrate. The positive holes reach the space charge layer 11 by diffusion and further reach the boundary plane between the N-type silicon substrate 1 and the highly insulating material layer 11 by the electric field. The positive holes having reached the boundary plane jump over the barrier of the highly insulating material layer 6 according to their energy or reach the surface 6*a* of the highly insulating material layer 6 due to the tunnel effect so as to be stored therein, thus neutralizing negative charges. Accordingly, the potential at the surface 6*a* of the highly insulating material layer 6 rises in accordance with the quantity of the injected light. If the target is again scanned with an electron beam, negative charges are supplied to the surface 6*a* to return its potential to its original potential (ground potential), thereby developing an output a signal.

In the cathode ray tube target of this invention, the space charge layer 11 is formed only at those areas corresponding to the apertured areas 9 of the metallic electrode S, so that it is possible to prevent the lateral spread of the positive holes produced by the incident light 12 after having reached the space charge layer 11. Usually, an increase in the reverse bias voltage results in the formation of a P-channel in the space charge layer 11 and, in the target employing the silicon monocrystal such, for example, as shown in FIG. 3, the entire area of the target is made conductive by the P-channel, so that the reverse bias voltage cannot be increased. Therefore, if the dark current is decreased by increasing the thickness of the highly insulating material layer 11, the external signal becomes small. However, if the reverse bias voltage is increased so as to increase the external signal the P-channel forms and lowers resolution.

In the cathode ray tube target of this invention, even if the P-channel is formed in the space charge layer 11, shortcircuiting by the P-channel does not occur because each space charge layer 11 is isolated from adjacent ones. Accordingly, even if the thickness of the highly insulating material layer 11 is relatively increased, the external signal can be increased without reducing resolution. Furthermore, the dark current can be decreased.

Figure 6:
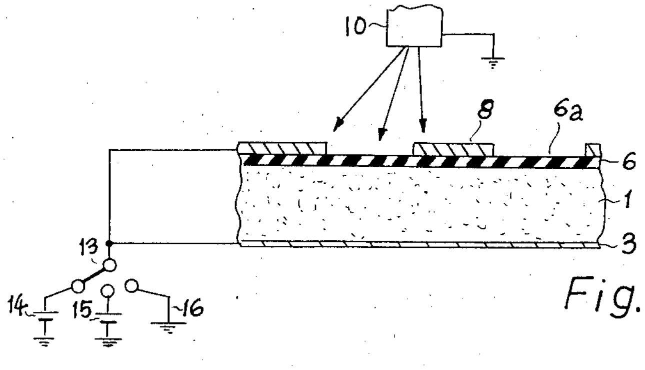
FIG. 6 is a schematic diagram for explaining a storage operation.

The cathode ray tube target of this invention can also be employed as a target of a storage tube for non-destructive reading. FIG. 6 is a diagram showing one example of its operation. The ohmic contact electrode 3 and the metallic electrode 8 are maintained in an equipotential condition, and a switch 13 is switched to a dc source 14 to hold the electrodes at a voltage of 10V. The target is scanned by a low speed electron beam, and the surface 6*a* of the highly insulating material layer 11 is set at ground potential. This is the so-called erasing operation. Then, the switch 13 is turned to a dc source 15 to hold the respective electrodes at a potential of 300V and a signal is applied to a grid (not shown) to achieve the writing-in operation.

Then, when the switch 13 is switched to the ground potential 16 to put the electrodes 5 and 8 to a grounded condition, the effect of signal variations to the grid remains in the surface 6*a* because the surface 6*a* of the highly insulating material layer 11 is set at a potential of 0 to − 10 V by the writing-in operation. Then, if the target is scanned by an electron beam, a current flows in the metallic electrode 8 in accordance with the grid action. This is read out as a target output signal.

As has been described in the foregoing, the cathode ray tube target of this invention can be readily produced. Furthermore, the target of this invention has advantages such as high resolution, less flaws and nonuniformity, and equality in function to the conventional silicon vidicon targets. Moreover, the cathode ray tube target of this invention can be employed not only as an image pickup tube target but also as a storage tube target, and hence can be widely used.

In the above embodiments of this invention, the N-type silicon substrate 1 is employed. However, the substrate 1 may be formed by P-type silicon or germanium. An example of the P-type semiconductor substrate 1 has a thickness of about 20 $\mu$m and a specific resistance of about 100 ohm/cm.

Figure 7:
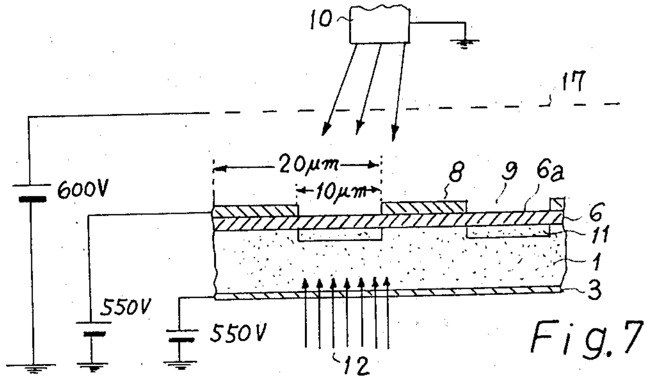

With reference to FIG. 7 showing one example of a signal image sensing operation by the cathode-ray tube target having the P-type semiconductor substrate 1, a positive potential of 600 V is applied to a collector mesh electrode 17 while electrodes 8 and 3 are held at the same positive potential of 550 V. If the target is scanned by an electron beam, the surface 6*a* of a highly insulating material layer 6 corresponding to an apertured area 9 becomes equipotential to the collector mesh electrode 17 by the action of secondary electrons of the scanning beam. As a result of this, a reverse bias voltage is developed between the highly insulating material layer 6 corresponding to the apertured areas 9 and the P-type semiconductor substrate 1, so that space charge layers 11 are developed in the P-type semiconductor substrate 1 so as to be respectively corresponding to the apertured areas 9. The separated space charge layers 11 have a function of a storage capacity having resolution in combination with the highly insulating material layer 6. Other operations are similar to the operations of the example shown in FIG. 5.

The target using the P-type semiconductor substrate 1 has such advantages as short residual image and high resolution caused by a small beam spot.

What I claim is:

1. A target of a cathode-ray tube comprising:

a. a semiconductor substrate of a single conductivity type monocrystalline semiconductor having a first and second major surface;

b. an electrode disposed on said first major surface of the semiconductor substrate and making ohmic contact therewith;

c. an insulating material layer having a resistivity greater than about $10^{12}$ ohms/cm disposed uniformly on said second major surface of said semiconductor substrate; and d. a metallic electrode disposed on the insulating material layer and having a plurality of apertures formed therein.

2. A target of a cathode-ray tube according to claim 1, in which the semiconductor substrate is of monocrystalline silicon.

3. A target of a cathode-ray tube according to claim 1, in which the semiconductor substrate is of P-type monocrystalline silicon.

4. A target of a cathode-ray tube according to claim 1, in which the apertures formed in said metallic electrode are regularly arranged circles.

5. A target of a cathode-ray tube comprising:

a. a semiconductor substrate of a single conductivity type monocrystalline semiconductor having a first and second major surface;

b. a first electrode disposed on said first major surface of said semiconductor substrate and making ohmic contact therewith;

c. a layer of insulating material selected from the group consisting of $Sb_2S_3$, $CaF_2$, PbO, $Si_3N_4$, and $SiO_2$ uniformly disposed on said second major surface of said semiconductor substrate; and d. a metallic second electrode disposed on said layer of insulating material and having a plurality of apertures formed therein.

* * * * *